US009087961B2

(12) United States Patent
Moon et al.

(10) Patent No.: US 9,087,961 B2
(45) Date of Patent: Jul. 21, 2015

(54) LIGHT EMITTING DEVICE AND LIGHTING SYSTEM

(71) Applicant: LG INNOTEK CO., LTD, Seoul (KR)

(72) Inventors: Yong Tae Moon, Seoul (KR); Hyun Chul Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/300,566

(22) Filed: Jun. 10, 2014

(65) Prior Publication Data

US 2014/0361246 A1     Dec. 11, 2014

(30) Foreign Application Priority Data

Jun. 11, 2013   (KR) ........................ 10-2013-0066663

(51) Int. Cl.
| | |
|---|---|
| H01L 29/06 | (2006.01) |
| H01L 33/32 | (2010.01) |
| H01L 33/00 | (2010.01) |
| H01L 33/06 | (2010.01) |
| H01L 33/14 | (2010.01) |
| H01L 33/04 | (2010.01) |

(52) U.S. Cl.
CPC ............ *H01L 33/32* (2013.01); *H01L 33/0008* (2013.01); *H01L 33/04* (2013.01); *H01L 33/06* (2013.01); *H01L 33/14* (2013.01)

(58) Field of Classification Search
None
See application file for complete search history.

(56) References Cited

U.S. PATENT DOCUMENTS

| | | | | |
|---|---|---|---|---|
| 2003/0136970 A1* | 7/2003 | Takeya et al. | ................... | 257/90 |
| 2004/0051107 A1* | 3/2004 | Nagahama et al. | ............. | 257/79 |
| 2007/0272936 A1 | 11/2007 | Shin | ................................ | 257/97 |
| 2010/0044674 A1* | 2/2010 | Kim | ................................ | 257/13 |
| 2011/0309328 A1* | 12/2011 | Kyono et al. | ................... | 257/13 |
| 2012/0248407 A1 | 10/2012 | Toyoda et al. | ................... | 257/13 |
| 2013/0105762 A1 | 5/2013 | Kyono et al. | ................... | 257/13 |
| 2014/0191192 A1* | 7/2014 | Han et al. | ......................... | 257/13 |

FOREIGN PATENT DOCUMENTS

| | | |
|---|---|---|
| EP | 1 914 813 A2 | 4/2008 |
| EP | 2 144 306 A1 | 1/2010 |
| EP | 2 408 028 A2 | 1/2012 |
| WO | WO 2013/018937 A1 | 2/2013 |

OTHER PUBLICATIONS

European Search Report dated Oct. 13, 2014 issued in Application No. 14171853.6.

* cited by examiner

*Primary Examiner* — Bilkis Jahan
(74) *Attorney, Agent, or Firm* — Ked & Associates, LLP

(57) ABSTRACT

A light emitting device includes a first conductive semiconductor layer (112), an active layer (114) including a quantum well (114*w*) and a quantum barrier (114*b*) on the first conductive semiconductor layer (112). An undoped last barrier layer (127) is provided on the active layer (114), and an $Al_xIn_yGa_{(1-x-y)}N$ ($0 \leq x \leq 1$, $0 \leq y \leq 1$)-based layer (128) is provided on the undoped last barrier layer (127). A second conductive semiconductor layer (116) is provided on the $Al_xIn_yGa_{(1-x-y)}N$-based layer (128).

20 Claims, 6 Drawing Sheets

LIGHT EMITTING DEVICE AND LIGHTING SYSTEM

CROSS-REFERENCE TO RELATED APPLICATION(S)

This application claims priority under 35 U.S.C. §119 to Korean Application No. 10-2013-0066663 filed on Jun. 11, 2013, whose entire disclosure(s) is/are hereby incorporated by reference.

BACKGROUND

1. Field

The embodiment relates to a light emitting device, a method of manufacturing the same, a light emitting device package, and a lighting system.

2. Background

A light emitting device (LED) includes a p-n junction diode having a characteristic of converting electric energy into light energy. The p-n junction diode can be formed by combining group III-V elements of the periodic table. The light emitting device can represent various colors by adjusting the compositional ratio of compound semiconductors.

When a forward voltage is applied to an LED, electrons of an n layer are combined with holes of a p layer, so that energy corresponding to an energy gap between a conduction band and a valance band may be released. This energy is mainly realized as heat or light, and the LED emits the energy as the light.

For instance, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been developed and extensively used.

Recently, as the demand for the high-efficiency LED has been increased, the improvement of the intensity of light has been issued.

In order to improve the intensity of light, various attempts, such as improvement of a multi-quantum well (MQW) of an active layer, improvement of an electron blocking layer and improvement of a layer below the active layer, have been performed, but the great effect is not achieved.

BRIEF DESCRIPTION OF THE DRAWINGS

The embodiments will be described in detail with reference to the following drawings in which like reference numerals refer to like elements wherein.

DETAILED DESCRIPTION

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

A light emitting device includes an N type semiconductor layer and a P type semiconductor layer, which may serve as a basic light emitting structure, and includes an electron blocking layer between the active layer and the P type semiconductor layer, so that electrons having high mobility are blocked, thereby improving the light emitting efficiency.

A last barrier is provided between a last quantum well and an electron blocking layer so that an quantum confinement effect may be provided to the last quantum well and perform a function of protecting the active layer, by which an Mg dopant of the electron blocking layer is prevented from being infiltrated into the quantum well of the active layer.

The last barrier includes last GaN and InGaN barriers, which creates various problems. For example, according to the last GaN barrier, the internal field of the quantum well is increased by the stress caused due to the lattice mismatch between the InGaN quantum well adjacent to the P type semiconductor and the last GaN barrier, so that the light emitting effect of the quantum well is deteriorated.

To the contrary, according to the last InGaN barrier, although the lattice mismatch between the InGaN quantum well adjacent to the P type semiconductor and the last InGaN barrier is reduced when compared with that of the last GaN barrier, the energy band gap of the last InGaN barrier is less than that of the last GaN barrier, so that the quantum confinement effect of electrons in the quantum well is reduced.

The light emitting efficiency of the structure (last GaN barrier) having a superior quantum confinement effect may be deteriorated due to the stress caused by the lattice mismatch, and the quantum confinement effect of the structure having a reduced lattice mismatch (last InGaN barrier) may be reduced so that the current injection efficiency of a device may be deteriorated, causing the technical contradiction.

To solve the technical contradiction, it is requested to develop a light emitting device capable of effectively increasing the quantum confinement effect while minimizing the stress applied to the quantum well.

(Embodiment)

Figure 1:
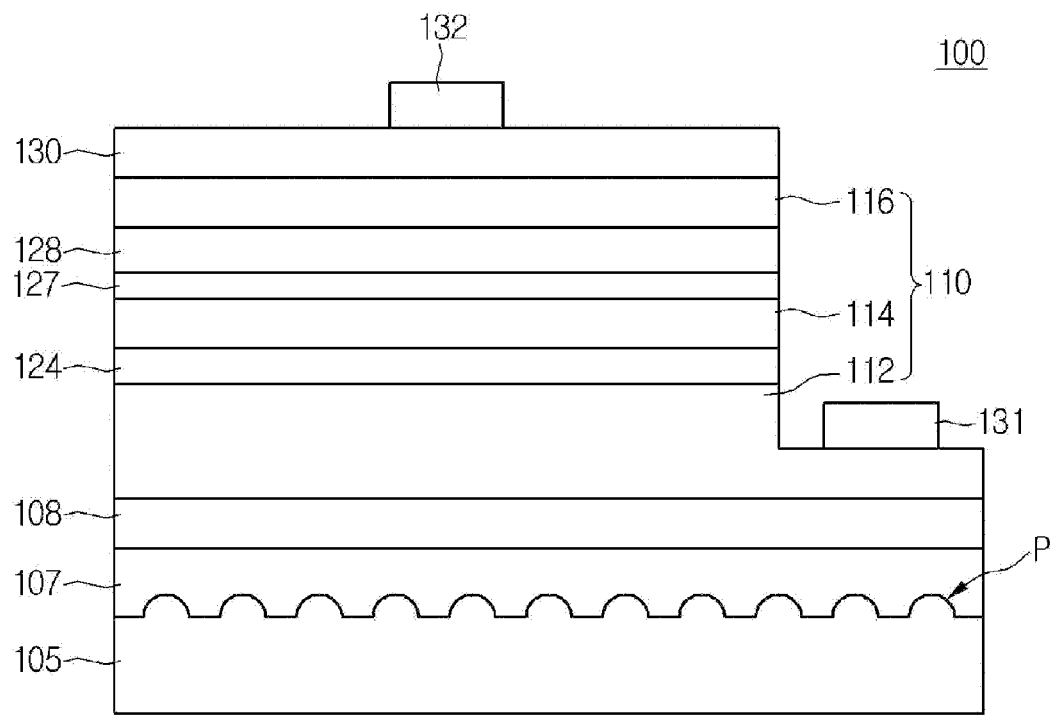
FIG. 1 is a sectional view showing a light emitting device according to the embodiment.
Figure 2:
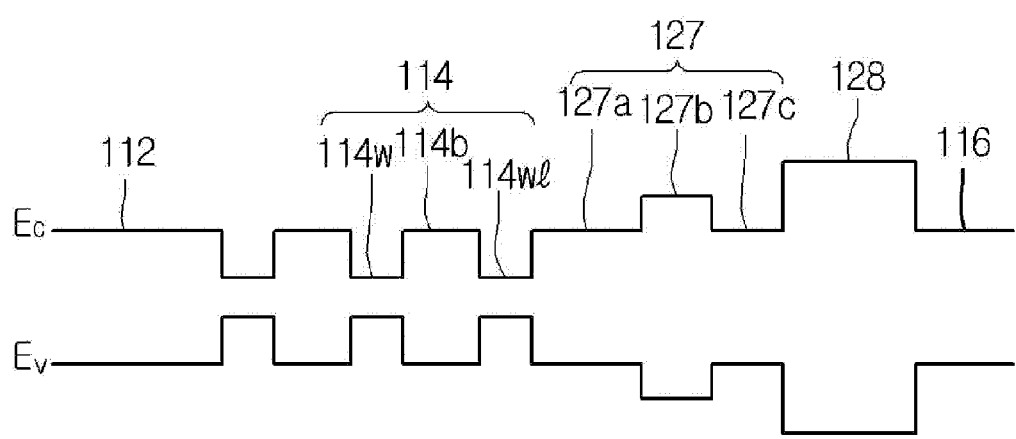
FIG. 2 is a view illustrating the first example of an energy band diagram of a light emitting device according to the embodiment.

FIG. 1 is a sectional view showing a light emitting device 100 according to the embodiment. FIG. 2 is a view illustrating the first example of an energy band diagram of a light emitting device 100 according to the embodiment. A light emitting device 100 according to the embodiment may include a first conductive semiconductor layer 112, an active layer 114 including a quantum well 114w and a quantum barrier 114b on the first conductive semiconductor layer 112, an undoped last barrier layer 127 on the active layer 114, an AlxInyGa(1−x−y)N (0≤x≤1, 0≤y≤1)-based layer 128 on the undoped last barrier layer 127, and a second conductive semiconductor layer 116 on the AlxInyGa(1−x−y)N-based layer 128.

The AlxInyGa(1-x-y)N-based layer 128 may serve as an electron blocking layer. Further, according to the embodiment, the undoped last barrier layer 127 may include a first $In_{p1}Ga_{1-p1}N$ ($0<p1<1$) layer 127a, an $Al_qGa_{1-q}N$ ($0<q<1$) layer 127b on the first $In_{p1}Ga_{1-p1}N$ layer 127a, and a second $In_{p2}Ga_{1-p2}N$ ($0<p2<1$) layer 127c on the $Al_qGa_{1-q}N$ layer 127b. According to the embodiment, the undoped last barrier layer 127 having the structure described above is provided so that a quantum confinement effect, light emitting efficiency, and device reliability may be improved.

In detail, according to the embodiment, since Al is included in the $Al_qGa_{1-q}N$ layer 127b, the bandgap energy level is relatively increased, so that the energy bandgap of the $Al_qGa_{1-q}N$ layer 127b may be greater than those of the first $In_{p1}Ga_{1-p1}N$ layer 127a and the second $In_{p2}Ga_{1-p2}N$ layer 127c. In addition, the energy bandgap of the $Al_qGa_{1-q}N$ layer 127b may be greater than that of the quantum barrier 114b of the active layer 114. Thus, since the energy bandgap of the $Al_qGa_{1-q}N$ layer 127b in the undoped last barrier layer 127 is greater than that of the quantum barrier of the active layer, the electrons in the quantum well may be effectively trapped.

According to the embodiment, the $Al_qGa_{1-q}N$ layer 127b may have a thickness in the range of 1 nm to 5 nm. Since the quantum mechanical electron confinement effect is deteriorated when the thickness of the $Al_qGa_{1-q}N$ layer 127b is less than 1 nm, the $Al_qGa_{1-q}N$ layer 127b may have a thickness of 1 nm or more. Since the carrier (hole) injection efficiency from the second conductive semiconductor layer 116 to the active layer 114 may be deteriorated when the thickness of the $Al_qGa_{1-q}N$ layer 127b exceeds 5 nm, the thickness of the $Al_qGa_{1-q}N$ layer 127b may have a thickness of 5 nm or less.

The plane-directional lattice constants of the first $In_{p1}Ga_{1-p1}N$ layer 127a and the second $In_{p2}Ga_{1-p2}N$ layer 127c is less than that of the quantum well 114w of the active layer 114, so that the electrons may be effectively trapped in the quantum well having the relatively greater lattice constant. In addition, the energy bandgaps of the first $In_{p1}Ga_{1-p1}N$ layer 127a and the second $In_{p2}Ga_{1-p2}N$ layer 127c is greater than that of the quantum well 114w of the active layer 114, so that the electrons may be effectively trapped in the quantum well.

The plane-directional lattice constants of the first $In_{p1}Ga_{1-p1}N$ layer 127a and the second $In_{p2}Ga_{1-p2}N$ layer 127c may be greater than that of the $Al_qGa_{1-q}N$ layer 127b. According to the embodiment, the plane-directional lattice constants of the first $In_{p1}Ga_{1-p1}N$ layer 127a and the second $In_{p2}Ga_{1-p2}N$ layer 127c in the undoped last barrier layer 127 may be greater than that of the $Al_qGa_{1-q}N$ layer 127b, the stress applied from the $Al_qGa_{1-q}N$ layer 127b to the quantum well 114w may be relieved.

The internal field applied to the quantum well 114w in the active layer 114 is reduced so that the light emitting coupling probability of electrons and holes in the quantum well may be increased, thereby improving the light emitting efficiency. The undoped last barrier layer 127 according to the embodiment may minimize the stress applied to the active layer, and at the same time, may effectively confine electrons based on quantum mechanics.

In addition, according to the embodiment, since the $Al_qGa_{1-q}N$ layer 127b is not doped with P type dopants and the lattice constant of the $Al_qGa_{1-q}N$ layer 127b in the surface direction is less than the lattice constant of the first $In_{p1}Ga_{1-p1}N$ layer 127a and the second $In_{p2}Ga_{1-p2}N$ layer 127c, the infiltration of Mg dopants, which are P type dopants, toward the active layer 114 of the second conductive semiconductor layer 116 may be effectively blocked, so that the long-term reliability of a device may be improved.

Further, according to the embodiment, the energy bandgap of the $Al_qGa_{1-q}N$ layer 127b may be less than that of AlxInyGa(1-x-y)N-based layer 128. The $Al_qGa_{1-q}N$ layer 127b may have an energy barrier enough to block electrons and the energy bandgap of the $Al_qGa_{1-q}N$ layer 127b may be less than that of the AlxInyGa(1-x-y)N-based layer 128 such that the energy barrier may not serve as a barrier with respect to the hole injection, but the embodiment is not limited thereto.

Figure 3:
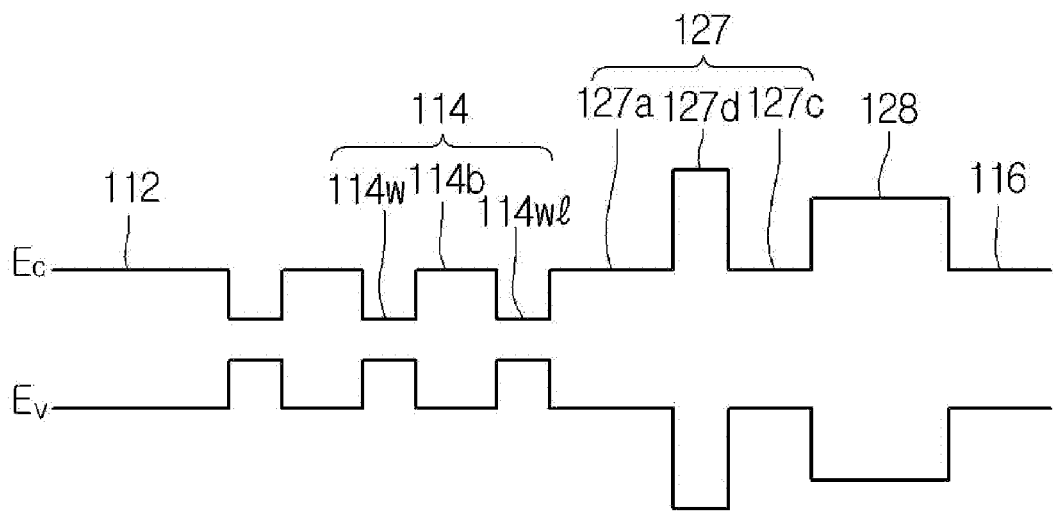
FIG. 3 is a view illustrating the second example of an energy band diagram of a light emitting device according to the embodiment.

FIG. 3 is a view illustrating the second example of an energy band diagram of a light emitting device according to the embodiment. According to the embodiment, as shown in FIG. 3, the energy bandgap of the $Al_qGa_{1-q}N$ layer 127d may be greater than that of the AlxInyGa(1-x-y)N-based layer 128.

According to the embodiment, since the energy bandgap of the $Al_qGa_{1-q}N$ layer 127d is greater than that of the AlxInyGa(1-x-y)N-based layer 128, the electron blocking function may be performed, so that the energy bandgap of the $Al_qGa_{1-q}N$ layer 127d may be greater than that of the AlxInyGa(1-x-y)N-based layer 128 to the extent that the hole injection effect is not disturbed.

According to the embodiment, a thickness of the $Al_qGa_{1-q}N$ layer 127b may be less than that of the first $In_{p1}Ga_{1-p1}N$ layer 127a or the second $In_{p2}Ga_{1-p2}N$ layer 127c. In order to effectively perform the electron blocking function while the stress generated due to the lattice constant difference is minimized, the thickness of the $Al_qGa_{1-q}N$ layer 127b may be less than that of the first $In_{p1}Ga_{1-p1}N$ layer 127a or the second $In_{p2}Ga_{1-p2}N$ layer 127c, and the energy bandgap of the $Al_qGa_{1-q}N$ layer 127d may be greater than that of the AlxInyGa(1-x-y)N-based layer 128, but the embodiment is not limited thereto.

For example, according to the embodiment, the thickness of the $Al_qGa_{1-q}N$ layer 127b may be reduced without increasing the concentration of Al, so that the generation of the stress due to the lattice constant difference may be minimized through a scheme of increasing a substantial bandgap energy level by decreasing the thickness without increasing the concentration of Al.

Figure 4:
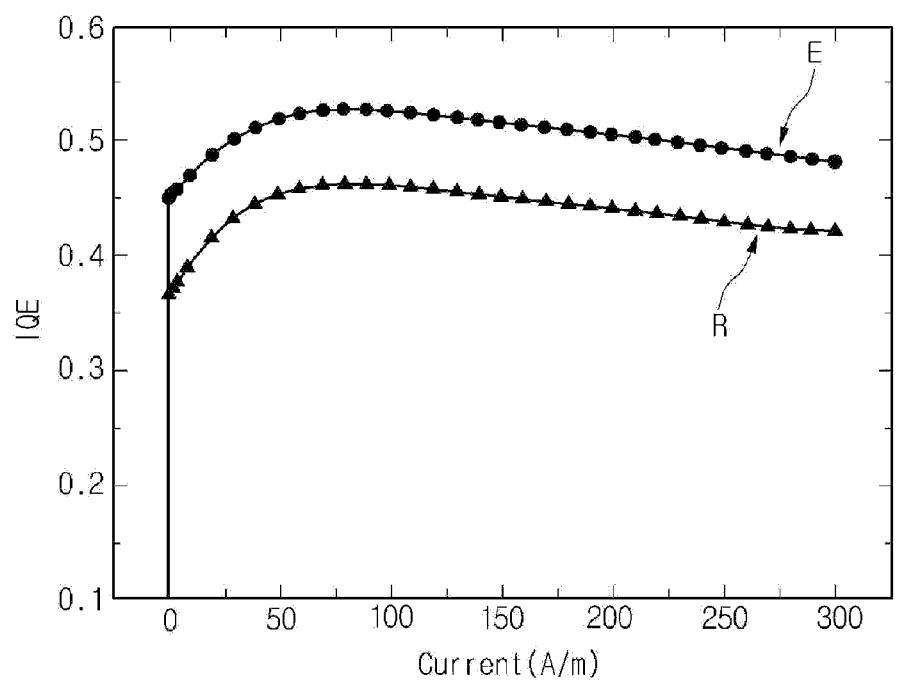
FIG. 4 is a graph illustrating internal quantum efficiency of a light emitting device according to the embodiment.

FIG. 4 is a graph that compares the internal quantum efficiency (IQE) of a light emitting device according to the embodiment E with the internal quantum efficiency of a comparative example R. The comparative example R is an example of employing a GaN last barrier of 8 mm. The embodiment E is an experimental example in which the undoped last barrier layer 127 includes a first $In_{p1}Ga_{1-p1}N$ layer 127a, an $Al_qGa_{1-q}N$ layer and a second $In_{p2}Ga_{1-p2}N$ layer 127.

In case of the comparative example R, when the current is 300 A/m, the internal quantum efficiency is about 42%, but in case of the embodiment E, the internal quantum efficiency is about 48%. Thus, the internal quantum efficiency of the embodiment is improved by about 6%.

According to the embodiment, a light emitting device including an optimal structure capable of increasing the intensity of light, a method of manufacturing the same, a light emitting device package, and a lighting system may be provided.

In addition, according to the embodiment, a light emitting device capable of minimizing the stress applied to a quantum well and effectively increasing a quantum confinement effect, a method of manufacturing the same, a light emitting device package, and a lighting system may be provided.

Thus, according to the embodiment, a light emitting device capable of improving a quantum confinement effect, light emitting efficiency, and device reliability, a method of manufacturing the same, a light emitting device package, and a lighting system may be provided.

Figure 5:
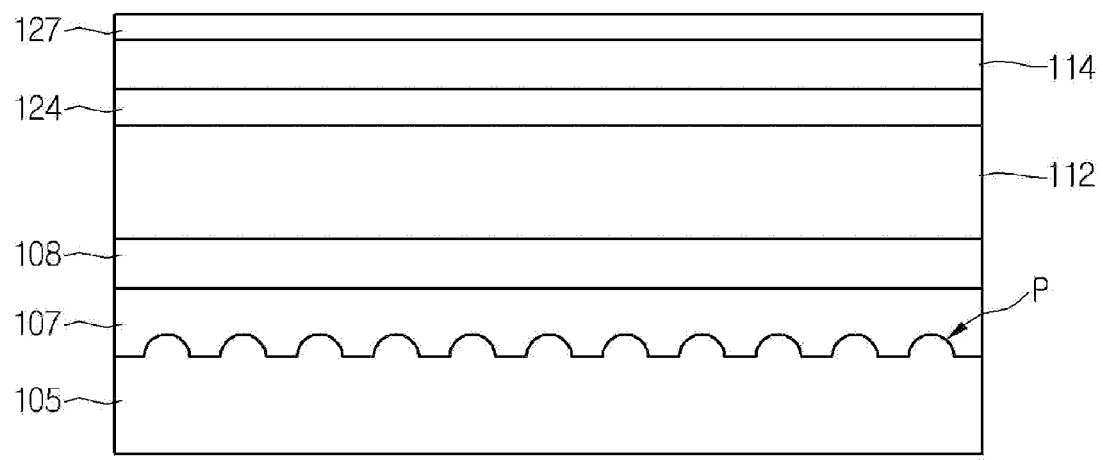
FIGS. 5 to 9 are sectional views illustrating a method of manufacturing a light emitting device according to the embodiment.

Hereinafter, a method of manufacturing a light emitting device according to the embodiment will be described with reference to FIGS. 5 to 9. First, as shown in FIG. 5, a substrate 105 is prepared. The substrate 105 may be formed of a material having superior thermal conductivity and may include a conductive substrate or an insulating substrate. For instance, the substrate 105 may include at least one of Al2O3, SiC, Si, GaAs, GaN, ZnO, GaP, InP, Ge, and Ga2O3. A patterned sapphire substrate (PSS) P may be formed on the substrate 105, but the embodiment is not limited thereto.

The substrate 105 may be wet-washed to remove impurities from a surface thereof. Then, a light emitting structure 110 including a first conductive semiconductor layer 112, an active layer 114 and a second conductive layer 116 on the substrate 105 may be formed.

In addition, a buffer layer 107 may be formed on the substrate 105. The buffer layer 107 may attenuate the lattice mismatch between a material of the light emitting structure 110 and the substrate 105. The buffer layer 107 may be formed of group III-V compound semiconductors. For example, the buffer layer 107 may include at least one of GaN, InN, AlN, InGaN, AlGaN, InAlGaN, and AlInN. An undoped semiconductor layer 108 may be formed on the buffer layer 107, but the embodiment is not limited thereto.

The first conductive semiconductor layer 112 may be formed of a semiconductor compound, such as group III-V or group II-VI compound semiconductor, and doped with the first conductive dopants. When the first conductive semiconductor layer 112 is an N-type semiconductor layer, the first conductive dopant may be an N-type dopant, such as Si, Ge, Sn, Se or Te, but the embodiment is not limited thereto.

The first conductive semiconductor layer 112 may include a semiconductor material having a compositional formula of $In_xAl_yGa_{1-x-y}N$ ($0 \leq x \leq 1$, $0 \leq y \leq 1$, $0 \leq x+y \leq 1$). The first conductive semiconductor layer 112 may include at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductive semiconductor layer 112 may include an N type GaN layer formed through a chemical deposition vapor (CVD) scheme, a molecular beam epitaxy (MBE) scheme, a sputtering scheme, or a hydride vapor phase epitaxy (HVPE) scheme. In addition, the first conductive semiconductor layer 112 may be formed by introducing trimethyl gallium gas (TMGa), ammonia gas (NH3), nitrogen gas (N2), and silane gas (SiH4) including N type dopants such as silicon (Si) into a chamber.

Then, the GaN-based superlattice layer 124 may be formed on the first conductive semiconductor layer 112. The GaN-based superlattice layer 124 may effectively attenuate the stress caused by the lattice mismatch between first conductive semiconductor layer 112 and the active layer 114. For example, the GaN-based superlattice layer 124 may be formed of $In_yAl_xGa_{(1-x-y)}N$ ($0 \leq x \leq 1$, $0 \leq y \leq 1$)/GaN, but the embodiment is not limited thereto. Then, the active layer 114 is formed on the GaN-based superlattice layer 124.

Electrons injected through the first conductive semiconductor layer 112 are combined with holes injected through the second conductive semiconductor layer 116 at the active layer 114, so the active layer 114 emits light having the energy which is determined according to an energy band of a material constituting the active layer 114 (light emitting layer). The active layer 114 may include at least one of a single quantum well structure, a multi quantum well (MQW) structure, a quantum wire structure and a quantum dot structure. For instance, the active layer 114 may be formed with the MQW structure by injecting TMGa gas, NH3 gas, N2 gas, and trimethyl indium (TMIn) gas, but the embodiment is not limited thereto.

The quantum well 114w/quantum barrier 114b of the active layer 114 may include at least one of InGaN/GaN, InGaN/InGaN, GaN/AlGaN, InAlGaN/GaN, GaAs(InGaAs)/AlGaAs, and GaP(InGaP)/AlGaP, but the embodiment is not limited thereto. The quantum well 114w may be formed of material having a bandgap lower than a bandgap of the quantum barrier 114b. According to the embodiment, in order to minimize the stress applied to a quantum well and effectively increase a quantum confinement effect, an undoped last barrier 127 may be formed on the active layer 114.

Figure 6:
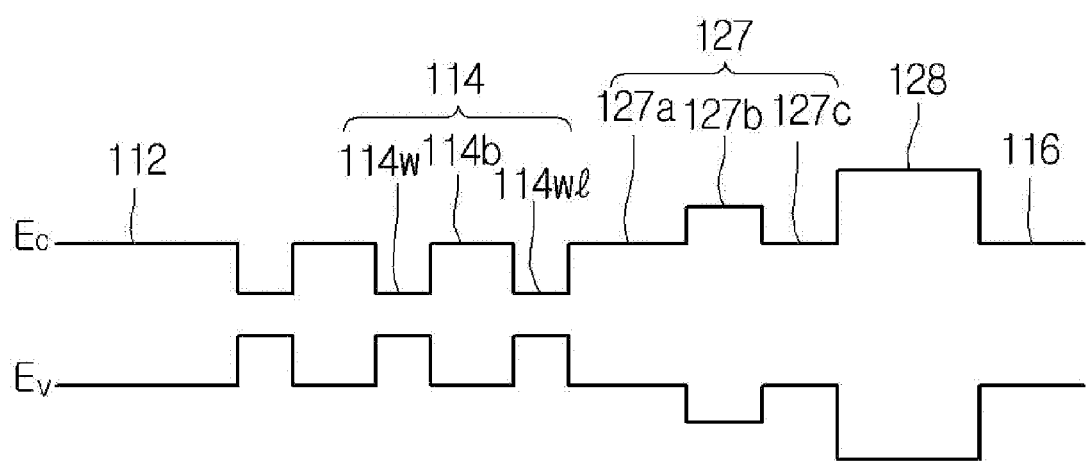

FIG. 6 is a view illustrating the first example of an energy band diagram of a light emitting device according to the embodiment. According to the embodiment, the undoped last barrier layer 127 may include a first $In_{p1}Ga_{1-p1}N$ ($0 \langle p1 \langle 1$) layer 127a, an $Al_qGa_{1-q}N$ ($0 \langle q \langle 1$) layer 127b on the first $In_{p1}Ga_{1-p1}N$ layer 127a, and a second $In_{p2}Ga_{1-p2}N$ ($0 \langle p2 \langle 1$) layer 127c on the $Al_qGa_{1-q}N$ layer 127b.

According to the embodiment, since Al is included in the $Al_qGa_{1-q}N$ layer 127b, the bandgap energy level is relatively increased, so that the energy bandgap of the $Al_qGa_{1-q}N$ layer 127b may be greater than those of the first $In_{p1}Ga_{1-p1}N$ layer 127a and the second $In_{p2}Ga_{1-p2}N$ layer 127c. In addition, since the energy bandgap of the $Al_qGa_{1-q}N$ layer 127b in the undoped last barrier layer 127 is greater than that of the quantum barrier of the active layer, the electrons in the quantum well may be effectively trapped.

According to the embodiment, the $Al_qGa_{1-q}N$ layer 127b may have a thickness in the range of 1 nm to 5 nm. Since the quantum mechanical electron confinement effect is deteriorated when the thickness of the $Al_qGa_{1-q}N$ layer 127b is less than 1 nm, the $Al_qGa_{1-q}N$ layer 127b may have a thickness of 1 nm or more. Since the carrier (hole) injection efficiency from the second conductive semiconductor layer 116 to the active layer 114 may be deteriorated when the thickness of the $Al_qGa_{1-q}N$ layer 127b exceeds 5 nm, the thickness of the $Al_qGa_{1-q}N$ layer 127b may have a thickness of 5 nm or less.

In addition, the plane-directional lattice constants of the first $In_{p1}Ga_{1-p1}N$ layer 127a and the second $In_{p2}Ga_{1-p2}N$ layer 127c is less than that of the quantum well 114w of the active layer 114, so that the electrons may be effectively trapped in the quantum well having the relatively greater lattice constant. In addition, the energy bandgaps of the first $In_{p1}Ga_{1-p1}N$ layer 127a and the second $In_{p2}Ga_{1-p2}N$ layer 127c is greater than that of the quantum well 114w of the active layer 114, so that the electrons may be effectively trapped in the quantum well.

According to the embodiment, the plane-directional lattice constants of the first $In_{p1}Ga_{1-p1}N$ layer 127a and the second $In_{p2}Ga_{1-p2}N$ layer 127c in the undoped last barrier layer 127 may be greater than that of the $Al_qGa_{1-q}N$ layer 127b, the stress applied from the $Al_qGa_{1-q}N$ layer 127b to the quantum well 114w may be relieved.

The internal field applied to the quantum well 114w in the active layer 114 is reduced so that the light emitting coupling probability of electrons and holes in the quantum well may be increased, thereby improving the light emitting efficiency. The undoped last barrier layer 127 according to the embodiment may minimize the stress applied to the active layer and at the same time, may effectively trap electrons in quantum mechanics.

In addition, according to the embodiment, since the AlqGa1−qN layer 127b is not doped with P type dopants and the lattice constant of the AlqGa1−qN layer 127b in the surface direction is less than those of the first Inp1Ga1−p1N layer 127a and the second Inp2Ga1−p2N layer 127c, the infiltration of Mg dopants, which are P type dopants, toward the active layer 114 of the second conductive semiconductor layer 116 may be effectively blocked, so that the long-term reliability of a device may be improved.

The AlqGa1−qN layer 127b may have an energy barrier enough o block electrons and the energy bandgap of the AlqGa1−qN layer 127b may be less than that of the AlxInyGa(1−x−y)N-based layer 128 such that the energy barrier may not serve as a barrier with respect to the hole injection.

In addition, FIG. 3 is a view illustrating the second example of an energy band diagram of a light emitting device according to the embodiment. According to the embodiment, as shown in FIG. 3, the energy bandgap of the AlqGa1−qN layer 127d may be greater than that of the AlxInyGa(1−x−y)N-based layer 128.

According to the embodiment, since the energy bandgap of the AlqGa1−qN layer 127d is greater than that of the AlxInyGa(1−x−y)N-based layer 128, the electron blocking function may be performed, so that the energy bandgap of the AlqGa1−qN layer 127d may be greater than that of the AlxInyGa(1−x−y)N-based layer 128 to the extent that the hole injection effect is not disturbed. A thickness of the AlqGa1−qN layer 127b may be less than that of the first Inp1Ga1−p1N layer 127a or the second Inp2Ga1−p2N layer 127c.

Thus, in order to effectively perform the electron blocking function while the stress generated due to the lattice constant difference is minimized, the thickness of the AlqGa1−qN layer 127b may be less than that of the first Inp1Ga1−p1N layer 127a or the second Inp2Ga1−p2N layer 127c, and the energy bandgap of the AlqGa1−qN layer 127d may be greater than that of the AlxInyGa(1−x−y)N-based layer 128, but the embodiment is not limited thereto.

According to the embodiment, a light emitting device capable of minimizing the stress applied to a quantum well and effectively increasing a quantum confinement effect, a method of manufacturing the same, a light emitting device package, and a lighting system may be provided.

Figure 7:
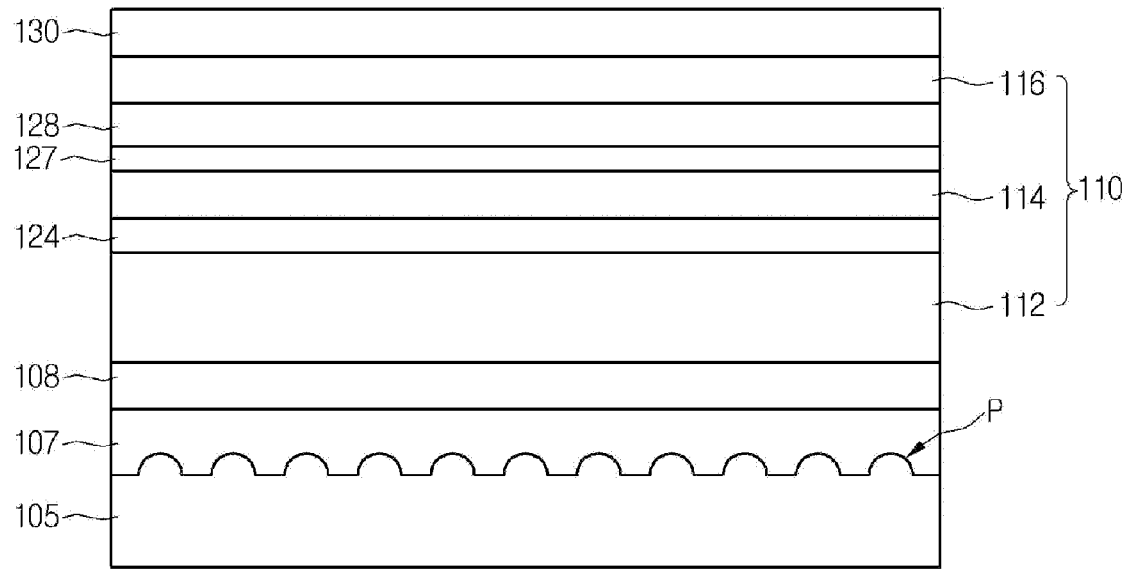

As shown in FIG. 7, an AlxInyGa(1−x−y)N ($0 \leq x \leq 1$, $0 \leq y \leq 1$)-based layer 128 may be formed on the undoped last barrier layer 122 and a second conductive semiconductor layer 116 may be formed on the AlxInyGa(1−x−y)N-based layer 128. The AlxInyGa(1−x−y)N-based layer 128 may perform the functions of electron blocking and MQW cladding, so that the light emitting efficiency may be improved.

The AlxInyGa(1−x−y)N-based layer 128 may have an energy bandgap greater than that of the active layer 114. The AlxInyGa(1−x−y)N-based layer 128 may be formed in a superlattice structure, but the embodiment is not limited thereto. In addition, the AlxInyGa(1−x−y)N-based layer 128 may be doped with P-type impurities. For example, Mg is ion-implanted into the AlxInyGa(1−x−y)N-based layer 128 in the concentration of about $10^{18}/cm^3$ to $10^{20}/cm^3$ to allow the AlxInyGa(1−x−y)N-based layer 128 to effectively block the overflowing electrons, so that the hole injection efficiency can be improved.

Next, the second conductive semiconductor layer 116 is formed on the AlxInyGa(1−x−y)N-based layer 128. The second conductive semiconductor layer 116 may be formed of a semiconductor compound, such as group III-V or group II-VI compound semiconductor, and doped with second conductive dopants.

For instance, the second conductive semiconductor layer 116 may include a semiconductor material having a compositional formula of InxAlyGa1−x−yN ($0 \leq x \leq 1$, $0 \leq y \leq 1$, $0 \leq x+y \leq 1$). If the second conductive semiconductor layer 116 is a P type semiconductor, the second conductive dopant is a P type dopant, such as Mg, Zn, Ca, Sr or Ba.

Then, a transparent electrode 130 is formed on the second conductive semiconductor layer 116. The transparent electrode 130 may include a transparent ohmic layer and can be formed to effectively inject a carrier by using a single metal or by laminating a meal alloy or metal oxide in a multiple structure.

The transparent electrode 130 may include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx and NiO, but the embodiment is not limited thereto.

According to the embodiment, the first conductive semiconductor layer 112 may be prepared as an N type semiconductor layer and the second conductive semiconductor layer 116 may be prepared as a P type semiconductor layer, but the embodiment is not limited thereto. In addition, a semiconductor layer having polarity opposite to that of the second conductive semiconductor layer 116, for instance, an N type semiconductor layer (not shown) may be formed on the second conductive semiconductor layer 116. Thus, the light emitting structure 110 may have one of an N-P junction structure, a P-N junction structure, an N-P-N junction structure and a P-N-P junction structure.

Figure 8:
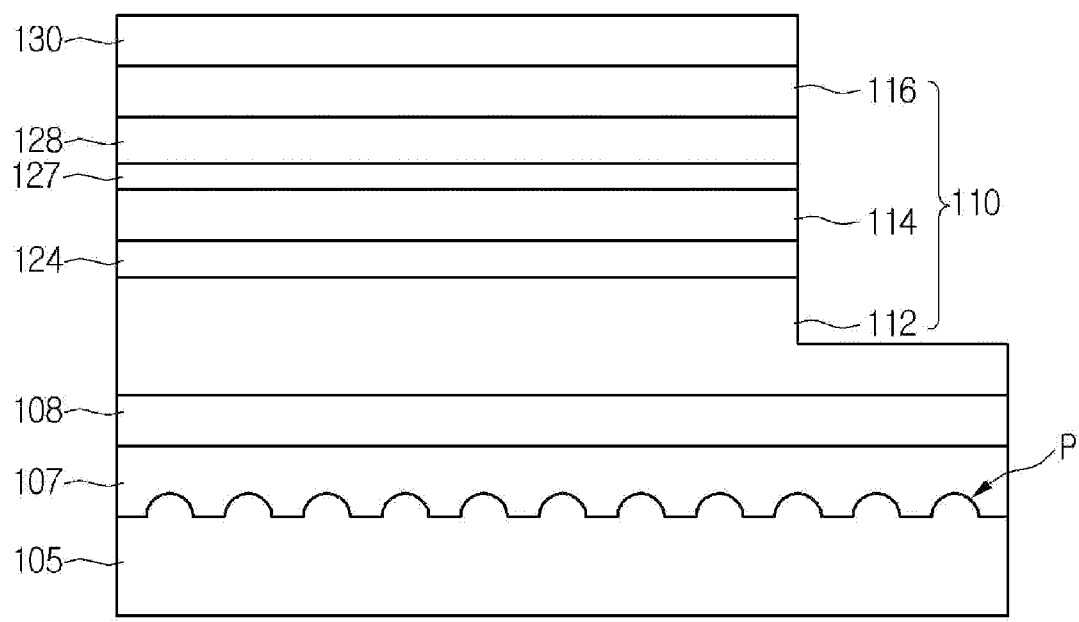

Next, as shown in FIG. 8, the transparent electrode 130, the second conductive semiconductor layer 116, the AlxInyGa(1−x−y)N-based layer 128, the undoped last barrier layer 127, the active layer 114 and the GaN-based superlattice layer 124 are partially removed to expose the first conductive semiconductor layer 112.

Figure 9:
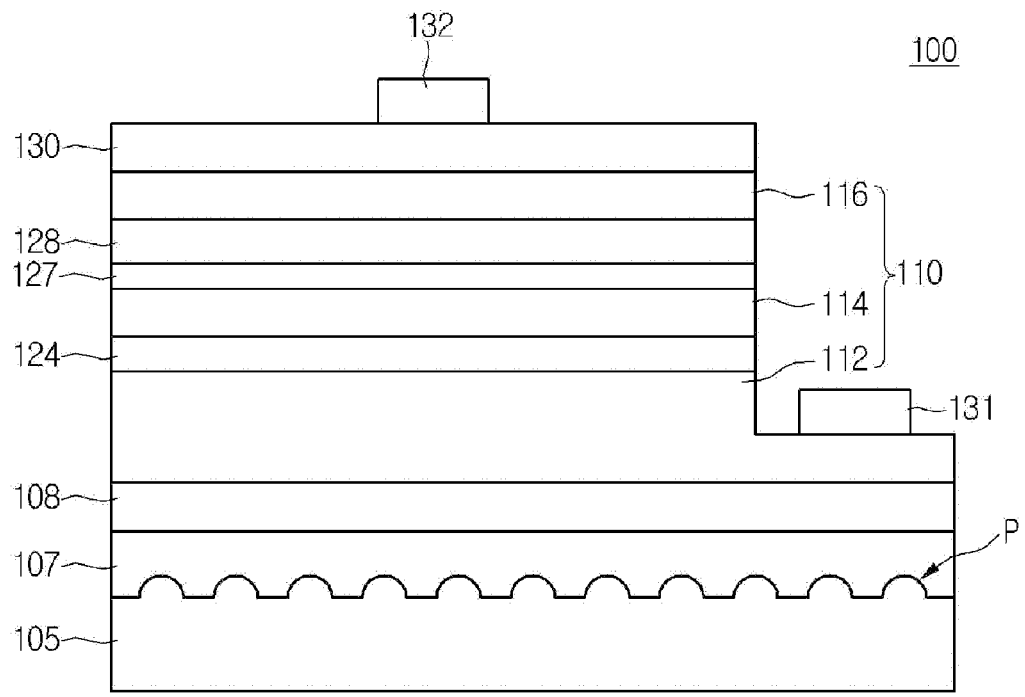

Then, as shown in FIG. 9, a second electrode 132 is formed on the transparent electrode 130 and a first electrode 131 is formed on the exposed first conductive semiconductor layer 112.

According to the embodiment, a light emitting device including an optimal structure capable of increasing the intensity of light, a method of manufacturing the same, a light emitting device package, and a lighting system may be provided.

Figure 10:
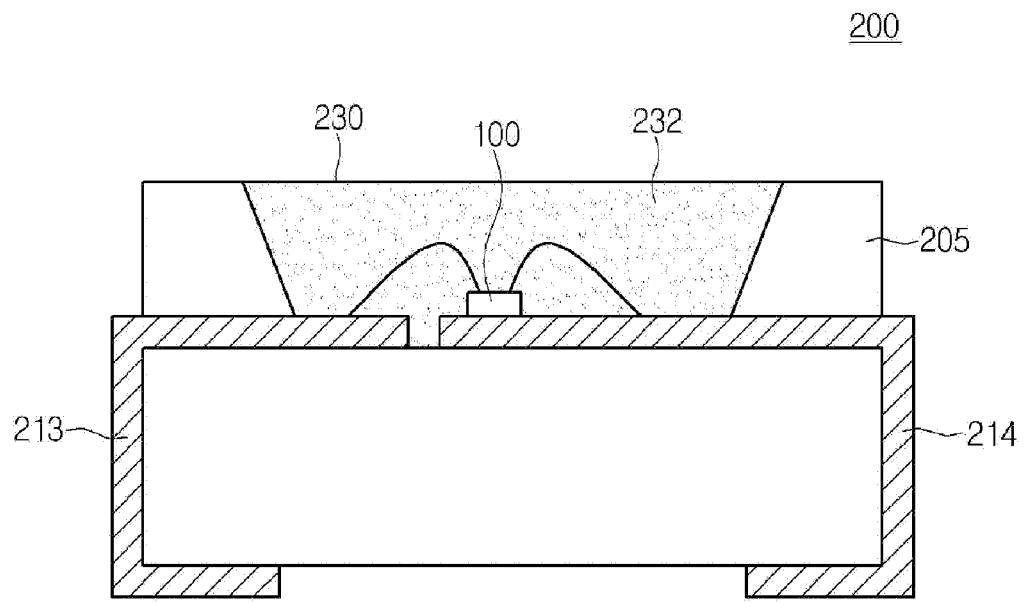
FIG. 10 is a sectional view illustrating a light emitting device package according to the embodiment.

A light emitting device capable of minimizing the stress applied to a quantum well and effectively increasing a quantum confinement effect, a method of manufacturing the same, a light emitting device package, and a lighting system may be provided. A light emitting device capable of improving a quantum confinement effect, light emitting efficiency, and device reliability, a method of manufacturing the same, a light emitting device package, and a lighting system may be provided FIG. 10 is a sectional view illustrating a light emitting device package 200 according to the embodiment. The light emitting device package 200 according to the embodiment includes a package body 205, third and fourth electrode layers 213 and 214 formed on the package body 205, the light emitting device 100 provided on the package body 205 and electrically connected to the third and fourth electrode layers 213 and 214, and a molding member 240 that surrounds the light emitting device 100. The package body 205 may include silicon, synthetic resin or metallic material. An inclined surface may be formed around the light emitting device 100.

The third and fourth electrode layers 213 and 214 may be electrically isolated from each other to supply power to the light emitting device 100. In addition, the third and fourth electrode layers 213 and 214 reflect the light emitted from the light emitting device 100 to improve the light efficiency and dissipate heat generated from the light emitting device 100 to the outside.

The lateral type light emitting device shown in FIG. 1 can be employed as the light emitting device 100, but the embodiment is not limited thereto. The light emitting device 100 may be installed on the package body 205 or the third and fourth electrode layers 213 and 214.

The light emitting device 100 is electrically connected to the third electrode layer 213 and/or the fourth electrode layer 214 through at least one of a wire bonding scheme, a flip chip bonding scheme and a die bonding scheme. According to the embodiment, the light emitting device 100 is electrically connected to the third electrode layer 213 through a wire and electrically connected to the fourth electrode layer 214 through the die bonding scheme, but the embodiment is not limited thereto.

The molding member 230 surrounds the light emitting device 100 to protect the light emitting device 100. In addition, the molding member 230 may include phosphors to change the wavelength of the light emitted from the light emitting device 100.

A plurality of light emitting device packages according to the embodiment may be arrayed on a substrate, and an optical member including a light guide plate, a prism sheet, a diffusion sheet or a fluorescent sheet may be provided on the optical path of the light emitted from the light emitting device package. The light emitting device package, the substrate, and the optical member may serve as a backlight unit or a lighting unit. For instance, the lighting system may include a backlight unit, a lighting unit, an indicator, a lamp or a streetlamp.

Figure 11:
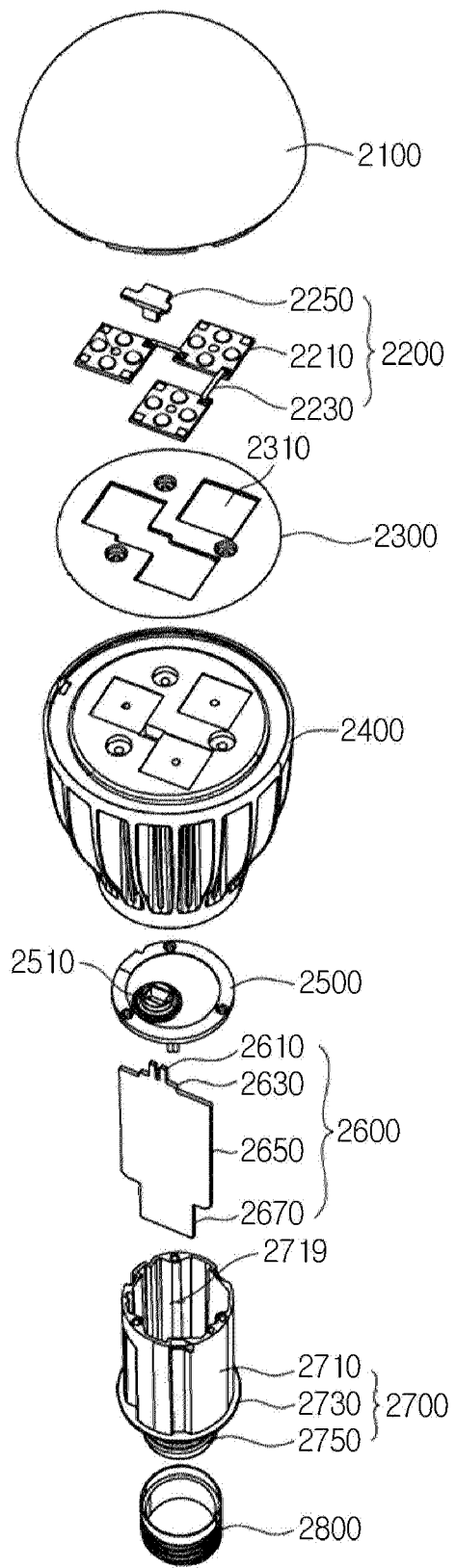
FIG. 11 is an exploded perspective view an example of a lighting system including the light emitting device according to the embodiment.

FIG. 11 is an exploded perspective view an example of a lighting system including the light emitting device according to the embodiment. As shown in FIG. 11, the lighting system according to the embodiment may include a cover 2100, a light source module 2200, a radiator 2400, a power supply part 2600, an inner case 2700, and a socket 2800. The lighting system according to the embodiment may further include at least one of a member 2300 and a holder 2500. The light source module 2200 may include the light emitting device 100 or the light emitting device module 200 according to the embodiment.

For example, the cover 2100 may have a blub shape, a hemisphere shape, a partially-open hollow shape. The cover 2100 may be optically coupled with the light source module 2200. For example, the cover 2100 may diffuse, scatter, or excite light provided from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 220 may be disposed at one surface of the radiator 2400. Accordingly, the heat from the light source module 220 is transferred to the radiator 2400. The light source module 2200 may include a light source 2210, a connection plate 2230, and a connector 2250.

The member 2300 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250. A surface of the member 2300 may be coated with a light reflective material. For example, the surface of the member 2300 may be coated with white paint. The member 2300 again reflects light, which is reflected by the inner surface of the cover 2100 and is returned to the direction of the light source module 2200, to the direction of the cover 2100. Accordingly, the light efficiency of the lighting system according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives heat from the light source module 2200 and the power supply part 2600 and radiates the heat.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion of the power supply part 2600.

The power supply part 2600 processes or converts an electric signal received from the outside and provides the processed or converted electric signal to the light source module 2200. The power supply part 2600 is received in the receiving groove of the inner case 2700, and is closed inside the inner case 2700 by the holder 2500. The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

According to the light emitting device, the method of manufacturing the same, the light emitting package, and the lighting system of the embodiment, the light extraction efficiency can be increased.

In addition, according to the embodiment, the optical efficiency can be increased.

The embodiment provides a light emitting device capable of increasing the intensity of light, a method of manufacturing the same, a light emitting device package, and a lighting system.

According to the embodiment, there is provided a light emitting device including: a first conductive semiconductor layer; an active layer including a quantum well and a quantum barrier on the first conductive semiconductor layer; an undoped last barrier layer on the active layer; an AlxInyGa(1−x−y)N (0≤x≤1, 0≤y≤1)-based layer on the undoped last barrier layer; and a second conductive semiconductor layer on the AlxInyGa(1−x−y)N-based layer.

The last barrier layer includes a first Inp1Ga1−p1N (0⟨ p1 ⟨ 1) layer on a last quantum well which is closest to the second conductive semiconductor layer in the quantum well; an AlqGa1−qN (0⟨ q⟨ 1) layer on the first Inp1Ga1−p1N layer; and a second Inp2Ga1−p2N (0⟨ p2⟨ 1) layer on the AlqGa1−qN layer.

According to the embodiment, there is provided a light emitting device including: a first conductive semiconductor layer; an active layer including a quantum well and a quantum barrier on the first conductive semiconductor layer; an undoped last barrier layer on the active layer; an AlxInyGa(1−x−y)N (0≤x≤1, 0≤y≤1)-based layer on the undoped last barrier layer; and a second conductive semiconductor layer on the AlxInyGa(1−x−y)N-based layer.

The last barrier layer comprises an AlqGa1−qN (0⟨ q⟨ 1) layer, and an energy bandgap of the AlqGa1−qN layer is greater than an energy gap of the AlxInyGa(1−x−y)N-based layer.

A lighting system according to the embodiment may include a light emitting unit having the light emitting device.

According to the embodiment, a light emitting device including an optimal structure capable of increasing the intensity of light, a method of manufacturing the same, a light emitting device package, and a lighting system may be provided.

In addition, according to the embodiment, a light emitting device capable of minimizing the stress applied to a quantum well and effectively increasing a quantum confinement effect, a method of manufacturing the same, a light emitting device package, and a lighting system may be provided.

Thus, according to the embodiment, a light emitting device capable of improving a quantum confinement effect, light emitting efficiency, and device reliability, a method of manufacturing the same, a light emitting device package, and a lighting system may be provided.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first conductive semiconductor layer;
an active layer including a quantum well and a quantum barrier on the first conductive semiconductor layer;
an undoped last barrier layer on the active layer;
an $Al_xIn_yGa_{(1-x-y)}N$ (0≤x≤1, 0≤y≤1) layer on the undoped last barrier layer; and
a second conductive semiconductor layer on the $Al_xIn_yGa_{(1-x-y)}N$ layer,
wherein the last barrier layer includes:
a first $In_{p1}Ga_{1-p1}N$ (0⟨ $p_1$⟨ 1) layer on a last quantum well which is closest to the second conductive semiconductor layer in the quantum well,
an $Al_qGa_{1-q}N$ (0⟨ q⟨ 1) layer on the first $In_{p1}Ga_{1-p1}N$ layer, and
a second $In_{p2}Ga_{1-p2}N$ (0⟨ $p_2$⟨ 1) layer on the $Al_qGa_{1-q}N$ layer.

2. The light emitting device of claim 1, wherein an energy bandgap of the $Al_qGa_{1-q}N$ layer is greater than an energy bandgap of the first $In_{p1}Ga_{1-p1}N$ layer.

3. The light emitting device of claim 1, wherein an energy bandgap of the $Al_qGa_{1-q}N$ layer is greater than an energy bandgap of the second $In_{p2}Ga_{1-p2}N$ layer.

4. The light emitting device of claim 1, wherein an energy bandgap of the $Al_qGa_{1-q}N$ layer is greater than energy bandgaps of the first $In_{p1}Ga_{1-p1}N$ layer and the second $In_{p2}Ga_{1-p2}N$ layer.

5. The light emitting device of claim 1, wherein an energy bandgap of the $Al_qGa_{1-q}N$ layer is greater than an energy bandgap of a quantum barrier of the active layer.

6. The light emitting device of claim 1, wherein an energy bandgap of the first $In_{p1}Ga_{1-p1}N$ layer is greater than an energy bandgap of the quantum well of the active layer.

7. The light emitting device of claim 1, wherein an energy bandgap of the second $In_{p2}Ga_{1-p2}N$ layer is greater than an energy bandgap of the quantum well of the active layer.

8. The light emitting device of claim 1, wherein energy bandgaps of the first $In_{p1}Ga_{1-p1}N$ layer and the second $In_{p2}Ga_{1-p2}N$ layer are greater than an energy bandgap of the quantum well of the active layer.

9. The light emitting device of claim 1, wherein lattice constants of the first $In_{p1}Ga_{1-p1}N$ layer and the second $In_{p2}Ga_{1-p2}N$ layer are greater than a lattice constant of the $Al_qGa_{1-q}N$ layer.

10. The light emitting device of claim 1, wherein lattice constants of the first $In_{p1}Ga_{1-p1}N$ layer and the second $In_{p2}Ga_{1-p2}N$ layer are greater than a lattice constant of the quantum well of the active layer.

11. The light emitting device of claim 1, wherein a thickness of the $Al_qGa_{1-q}N$ layer is less than a thickness of the first $In_{p1}Ga_{1-p1}N$ layer or the second $In_{p2}Ga_{1-p2}N$ layer.

12. A lighting system comprising a light emitting device of claim 1.

13. The light emitting device of claim 1, wherein an energy bandgap of the $Al_qGa_{1-q}N$ layer is greater than an energy bandgap of the $Al_xIn_yGa_{(1-x-y)}N$-based layer, and
wherein a thickness of the $Al_qGa_{1-q}N$ layer is less than a thickness of the $Al_xIn_yGa_{(1-x-y)}N$-based layer.

14. The light emitting device of claim 1, wherein lattice constants of the first $In_{p1}Ga_{1-p1}N$ layer and the second $In_{p2}Ga_{1-p2}N$ layer in a surface direction are greater than a lattice constant of the $Al_qGa_{1-q}N$ layer in a surface direction.

15. The light emitting device of claim 1, wherein a thickness of the $Al_qGa_{1-q}N$ layer is less than a thickness of the first $In_{p1}Ga_{1-p1}N$ layer and a thickness of the second $In_{p2}Ga_{1-p2}N$ layer, and
wherein an energy bandgap of the first $In_{p1}Ga_{1-p1}N$ layer is same with an energy bangap of the second $In_{p2}Ga_{1-p2}N$ layer.

16. A light emitting device comprising:
a first conductive semiconductor layer;
an active layer including a quantum well and a quantum barrier on the first conductive semiconductor layer;
an undoped last barrier layer on the active layer;
an $Al_xIn_yGa_{(1-x-y)}N$ ($0 \leq x \leq 1$, $0 \leq y \leq 1$) layer on the undoped last barrier layer; and
a second conductive semiconductor layer on the $Al_xIn_yGa_{(1-x-y)}N$ layer,
wherein the last barrier layer comprises an $Al_qGa_{1-q}N$ ($0 < q < 1$) layer, and
wherein an energy bandgap of the $Al_qGa_{1-q}N$ layer is greater than an energy gap of the $Al_xIn_yGa_{(1-x-y)}N$-based layer.

17. The light emitting device of claim 16, wherein the last barrier layer comprises:
a first $In_{p1}Ga_{1-p1}N$ ($0 < p_1 < 1$) layer on a last quantum well which is closest to the second conductive semiconductor layer among the quantum well;
an $Al_qGa_{1-q}N$ ($0 < q < 1$) layer on the first $In_{p1}Ga_{1-p1}N$ layer; and
a second $In_{p2}Ga_{1-p2}N$ ($0 < p_2 < 1$) layer on the $Al_qGa_{1-q}N$ layer.

18. The light emitting device of claim 17, wherein an energy bandgap of the $Al_qGa_{1-q}N$ layer is greater than energy bandgaps of the first $In_{p1}Ga_{1-p1}N$ layer and the second $In_{p2}Ga_{1-p2}N$ layer.

19. The light emitting device of claim 17, wherein an energy bandgap of the $Al_qGa_{1-q}N$ layer is greater than an energy bandgap of a quantum barrier of the active layer 114.

20. The light emitting device of claim 17, wherein lattice constants of the first $In_{p1}Ga_{1-p1}N$ layer and the second $In_{p2}Ga_{1-p2}N$ layer are greater than a lattice constant of the $Al_qGa_{1-q}N$ layer.

* * * * *